US011011904B2

(12) United States Patent
Fischer et al.

(10) Patent No.: US 11,011,904 B2
(45) Date of Patent: May 18, 2021

(54) LOW-VOLTAGE CIRCUIT BREAKER AND METHOD

(71) Applicant: Siemens Aktiengesellschaft, Munich (DE)

(72) Inventors: Andreas Fischer, Amberg (DE); Adelheid Gonschorek, Amberg (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 72 days.

(21) Appl. No.: 16/565,620

(22) Filed: Sep. 10, 2019

(65) Prior Publication Data

US 2020/0083697 A1 Mar. 12, 2020

(30) Foreign Application Priority Data

Sep. 11, 2018 (DE) ...................... 10 2018 215 442.2

(51) Int. Cl.
*H02H 3/00* (2006.01)
*H02H 3/16* (2006.01)
*H02H 1/00* (2006.01)
*H03M 1/12* (2006.01)

(52) U.S. Cl.
CPC .......... *H02H 3/165* (2013.01); *H02H 1/0007* (2013.01); *H02H 1/0092* (2013.01); *H03M 1/12* (2013.01)

(58) Field of Classification Search
CPC .... H02H 3/165; H02H 1/0092; H02H 1/0007; H02H 3/50; H02H 3/34; H02H 3/343; H03M 1/12
See application file for complete search history.

(56) References Cited

U.S. PATENT DOCUMENTS

| 6,292,717 B1* | 9/2001 | Alexander ......... G01R 19/2513 340/6.1 |
| 2002/0032535 A1* | 3/2002 | Alexander ........... G01R 21/133 702/64 |
| 2009/0027815 A1* | 1/2009 | Franke ..................... H02H 7/04 361/35 |

* cited by examiner

*Primary Examiner* — Adolf D Berhane
*Assistant Examiner* — Afework S Demisse
(74) *Attorney, Agent, or Firm* — Harness, Dickey & Pierce, P.L.C.

(57) ABSTRACT

An embodiment of the invention relates to a method for ground fault detection for low-voltage three-phase AC circuits having a neutral conductor, in which first to fourth analog current signals of the first to third phase conductors and of the neutral conductor of the three-phase AC circuit are ascertained that each contain the level or an equivalent of the level of the current. The analog current signals are time-division multiplexed, subjected to a/d conversion, and a sequence of time-division-multiplexed first to fourth digital current values present in first to fourth successive time frames form first to fourth current signals. Three of the four digital current signals are interpolated to ascertain interpolated current values. The current value of the time frame of the uninterpolated current signal and the interpolated current values for the time frame of the uninterpolated current signal are used for discovering the ground fault.

20 Claims, 3 Drawing Sheets

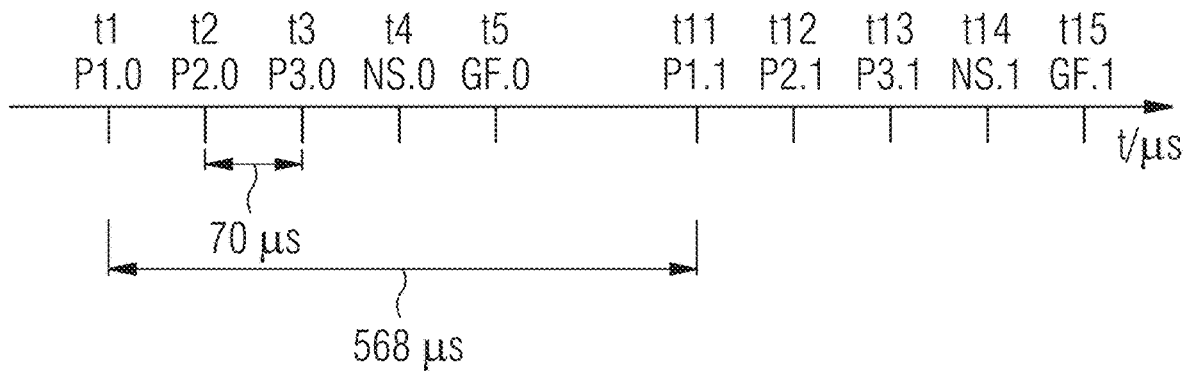
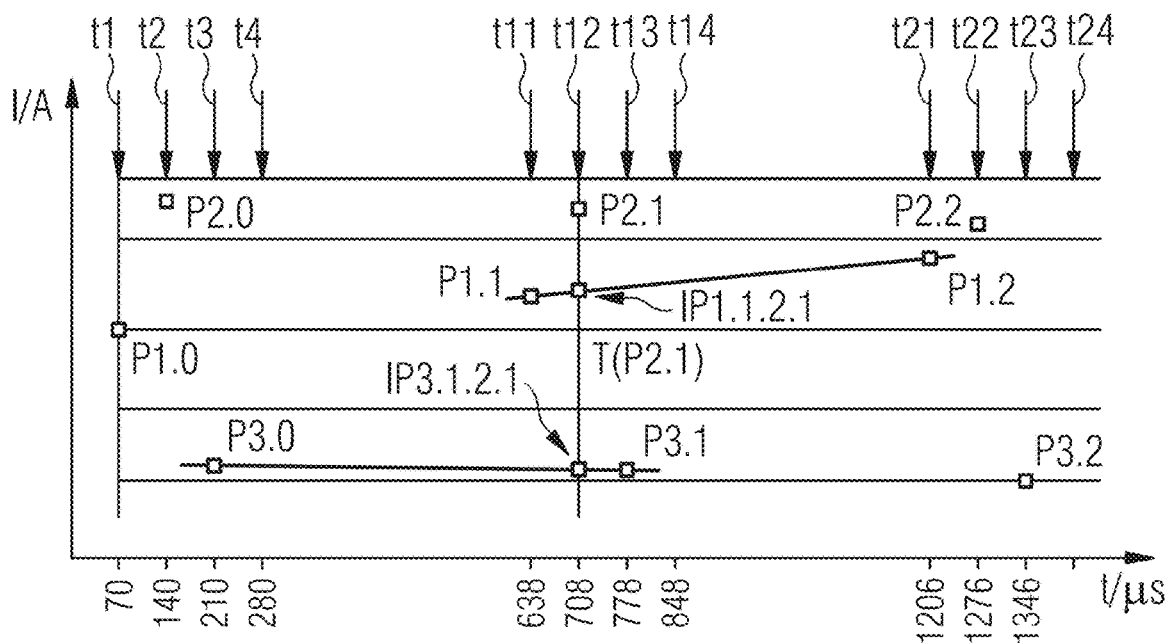

LOW-VOLTAGE CIRCUIT BREAKER AND METHOD

PRIORITY STATEMENT

The present application hereby claims priority under 35 U.S.C. § 119 to German patent application number DE 102018215442.2 filed Sep. 11, 2018, the entire contents of which are hereby incorporated herein by reference.

FIELD

Embodiments of the invention generally relate to a low-voltage circuit breaker for interrupting a low-voltage circuit, and to a method.

BACKGROUND

Circuit breakers are protective devices that work in similar fashion to a fuse. Circuit breakers monitor the current flowing through them by way of a conductor and interrupt the electric current or flow of energy to an energy sink or load, this being referred to as tripping, when protection parameters, such as current limit values or current/time interval limit values, i.e. when there is a current value for a certain time interval, are exceeded. The selected current limit values or current/time interval limit values are applicable grounds for tripping. The interruption is effected by contacts of the circuit breaker, for example, which are opened.

In particular for low-voltage circuits, installations or systems, there are different types of circuit breakers depending on the level of the envisaged electric current in the electrical circuit. Circuit breakers within the context of embodiments of the invention mean in particular switches such as those used in low-voltage installations for currents, in particular rated currents or maximum currents, of from 63 to 6300 amps. More specifically, enclosed circuit breakers are used for currents of from 63 to 1600 amps, in particular from 125 to 630 or 1200 amps. Exposed circuit breakers are used in particular for currents of from 630 to 6300 amps, more specifically from 1200 to 6300 amps.

Exposed circuit breakers are also referred to as air circuit breakers, ACB for short, and enclosed circuit breakers are referred to as molded case circuit breakers or compact circuit breakers, MCCB for short.

Low voltage devices involve in particular, voltages of up to 1000 volts AC or 1500 volts DC. Low voltage refers more specifically, in particular, to voltages higher than the extra-low voltage at values of 50 volts AC or 120 volts DC.

Circuit breakers within the context of the application refer, in particular, to circuit breakers having an electronic trip unit, ETU for short, which serves as a control unit.

When the flow of current is too high, circuit breakers interrupt the circuit in accordance with their protection parameters or response values. The protection parameters or response values are substantially the level of the current and the time after which interruption of the circuit is supposed to be effected when the flow of current is constantly "high". In contrast to a fuse, these protection parameters or response values for a circuit breaker are adjustable, for example via the electronic trip unit. The latter is usually fitted so as to be accessible via the front of the circuit breaker. The protection parameters are adjustable or parameterizable by this device.

The currents of the conductors of the low-voltage circuit are monitored by current sensors. These can be for example Rogowski coils, measuring resistors/shunts, Hall sensors/ magnetic field sensors, or the like. Some circuit breakers also allow the discovery or detection of ground faults. This can be effected for example by virtue of the ascertainment of the ground fault current (or fault current) being realized via a circuit node or a summation circuit. This method requires hardware components, therefore gives rise to costs and takes up circuit board area in the circuit breaker, for example in the electronic trip unit. Downstream of this circuit node, the fault current measurement signal that is present there, or the output signal of the summation circuit, which output signal corresponds to the fault current, is conditioned and is compared with analog or digital threshold values, and if certain criteria are met then the ground fault protection function is tripped. This variant, as already mentioned, is expensive.

It is also known practice to realize the ground fault detection by way of addition of the phase measured values in the firmware. To this end, the phase measured values are captured via multiple analog-to-digital converters or sample & hold elements at the same time.

SUMMARY

The inventors have discovered that measured values are present in parallel, so that there is no timing stagger between the measured values. Addition of the measured values allows fault current determination. In this context, one analog-to-digital converter per phase, inter alia, is needed.

At least one embodiment of the present invention to improve a low-voltage circuit breaker, in particular to allow the ascertainment of ground faults by the hardware at lower expense.

Embodiments of the present invention is achieved by a low-voltage circuit breaker or a method.

According to at least one embodiment of the present invention, a low-voltage circuit breaker with ground fault detection for low-voltage three-phase AC circuits having a neutral conductor is proposed, comprising:

a first to fourth current sensor, for ascertaining the level of the electric current of first to third phase conductors and of the neutral conductor of the three-phase AC circuit, which each provide first to fourth analog current signals;

an interruption unit having contacts, for interrupting the three-phase AC circuit; and an electronic trip unit, connected to the current sensors and the interruption unit and having a microprocessor, which are configured such that exceedance of current and/or current/time interval limit values for at least one phase conductor results in an interruption to the three-phase AC circuit being prompted.

Further, a coordinate advantageous method is disclosed in an embodiment, in which first to fourth analog current signals of the first to third phase conductors and of the neutral conductor of the three-phase AC circuit are ascertained that each contain the level or an equivalent of the level of the current. According to an embodiment of the invention, the analog current signals are time-division multiplexed, subjected to analog-to-digital conversion, so that there is a sequence of time-division-multiplexed first to fourth digital current signals that are present in first to fourth successive time frames. Three of the four digital current signals are interpolated, wherein interpolated current values for the time frame of the uninterpolated digital current signal are ascertained. The current value of the time frame of the uninterpolated current signal and the interpolated current values for the time frame of the uninterpolated current signal are used for discovering the ground fault.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

Further, a low-voltage circuit breaker with ground fault detection for a low-voltage three-phase AC circuit including a neutral conductor, is disclosed in an embodiment, the low-voltage circuit breaker comprising:

a plurality of current sensors including a first current sensor, a second current sensor, a third current sensor and a fourth current sensor, to each respectively ascertain a level of electric current of a respective one of a plurality of phase conductors including a first phase conductor, a second phase conductor, a third phase conductor and a neutral conductor of the low-voltage three-phase AC circuit, and to each respectively provide a respective one of a plurality of analog current signals including a first analog current signal, a second analog current signal, a third analog current signal and a fourth analog current signal;

an interruption unit including contacts, to interrupt the three-phase AC circuit;

an electronic trip unit, connected to the plurality of current sensors and the interruption unit and including a microprocessor, configured such that exceedance of at least one of current and current/time interval limit values for at least one phase conductor of the plurality of phase conductors results in an interruption to the three-phase AC circuit being prompted;

a multiplexer to receive the plurality of analog current signals and to supply time-division-multiplexed analog current signals to an analog-to-digital converter, the time-division-multiplexed analog current signals including four time-division-multiplexed digital current signals, each including a digital current value, resulting in four digital current values including a first digital current value, a second digital current value, a third digital current value, and a fourth digital current value respectively in a first successive time frame, a second successive time frame, a third successive time frame, and a fourth successive time frame, wherein three digital current signals of the four digital current signals are interpolated, via three respective interpolation functions, to respectively ascertain three interpolated current values for the time frame of an uninterpolated digital current signal of the plurality of digital current signals, resulting in a plurality of interpolated current values, and wherein a current value of the time frame of the uninterpolated current signal, and the plurality of interpolated current values for the respective time frame of the uninterpolated current signal, are used for detecting a ground fault.

Further, a method for discovering a ground fault for a low-voltage three-phase AC circuit including a neutral conductor, is disclosed in an embodiment in which a plurality of analog current signals including a first analog current signal, a second analog current signal, a third analog current signal and a fourth analog current signal, respectively of a first phase conductor, a second phase conductor, a third phase conductor and of the neutral conductor of the three-phase AC circuit, are ascertained to each contain a level or an equivalent of a level of current, the method comprising:

time-division multiplexing the plurality of analog current signals to subject the plurality of analog current signals to analog-to-digital conversion, to produce a sequence of a plurality of time-division-multiplexed digital current values including a first digital current value, a second digital current value, a third digital current value and a fourth digital current value, respectively present in first to fourth successive time frames and respectively forming a plurality of digital current signals including a first digital current signal, a second digital current signal, a third digital current signal and a fourth digital current signal; and interpolating three of four of the plurality of digital current signals, to respectively ascertain three interpolated current values for the time frame of an uninterpolated digital current signal of the plurality of digital current signals, resulting in a plurality of interpolated current values; and discovering the ground fault using a current value of the time frame of the uninterpolated current signal, and the plurality of interpolated current values for the time frame of the uninterpolated current signal.

Further, a non-transitory computer-readable storage medium storing electronically readable control information is disclosed in an embodiment, which when executed by a controller of a low-voltage three-phase AC circuit including a neutral conductor, in which a plurality of analog current signals including a first analog current signal, a second analog current signal, a third analog current signal and a fourth analog current signal, respectively of a first phase conductor, a second phase conductor, a third phase conductor and of the neutral conductor of the three-phase AC circuit, are ascertained to each contain a level or an equivalent of a level of current, configures the controller to perform at least:

time-division multiplexing the plurality of analog current signals to subject the plurality of analog current signals to analog-to-digital conversion, to produce a sequence of a plurality of time-division-multiplexed digital current values including a first digital current value, a second digital current value, a third digital current value and a fourth digital current value, respectively present in first to fourth successive time frames and respectively forming a plurality of digital current signals including a first digital current signal, a second digital current signal, a third digital current signal and a fourth digital current signal; and interpolating three of four of the plurality of digital current signals, to respectively ascertain three interpolated current values for the time frame of an uninterpolated digital current signal of the plurality of digital current signals, resulting in a plurality of interpolated current values; and discovering a ground fault using a current value of the time frame of the uninterpolated current signal, and the plurality of interpolated current values for the time frame of the uninterpolated current signal.

BRIEF DESCRIPTION OF THE DRAWINGS

The described properties, features and advantages of this invention and the manner in which they are achieved will become clearer and more distinctly comprehensible in conjunction with the description of the example embodiments that follows, the example embodiments being explained more specifically in conjunction with the drawing.

In the associated drawing:

FIG. 4 shows a first temporal representation to explain an embodiment of the invention;

FIG. 5 shows a second temporal representation to explain an embodiment of the invention.

DETAILED DESCRIPTION OF THE EXAMPLE EMBODIMENTS

Figure 1:
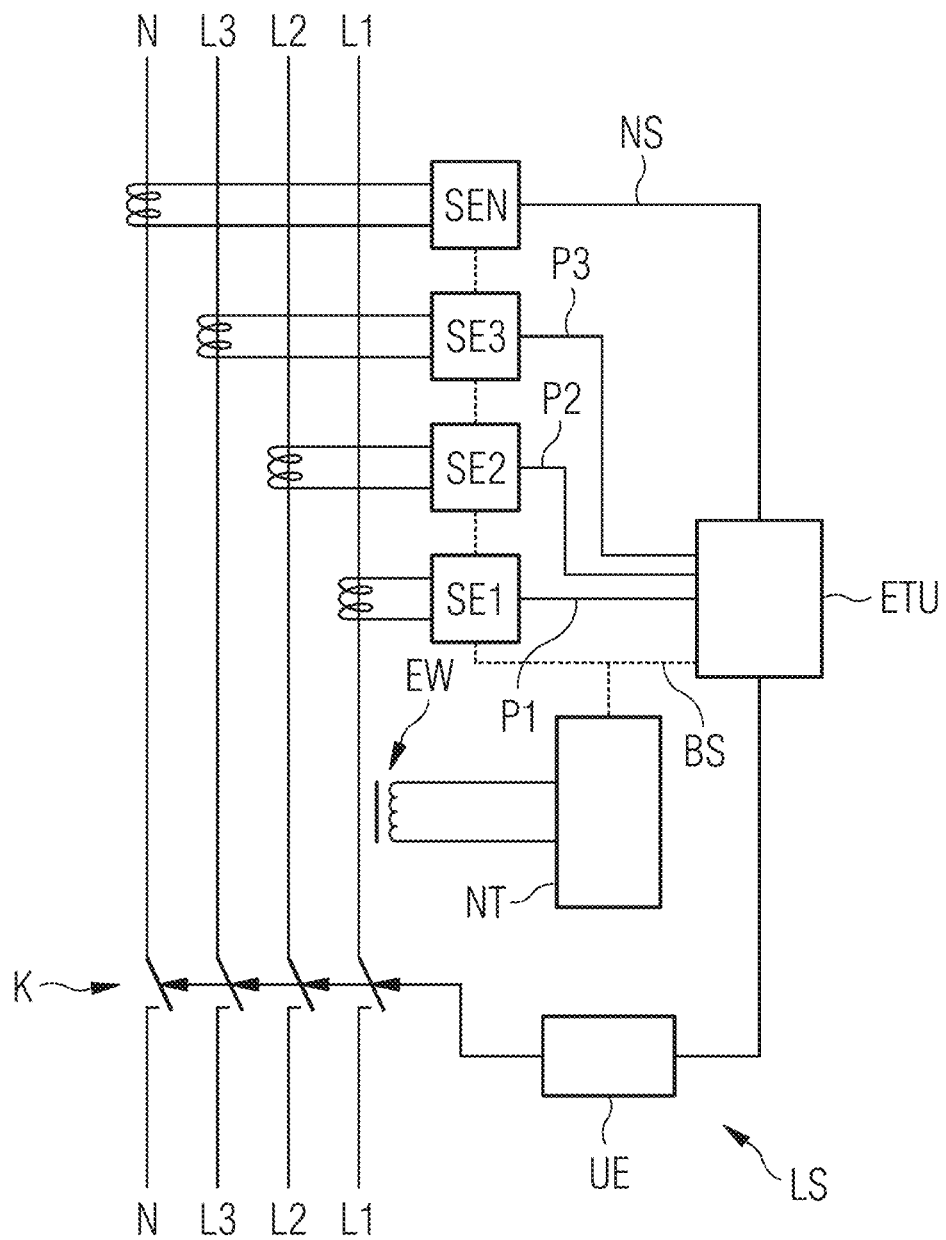
FIG. 1 shows a block diagram of a low-voltage circuit breaker.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to at least one embodiment of the present invention, a low-voltage circuit breaker with ground fault detection for low-voltage three-phase AC circuits having a neutral conductor is proposed, comprising:

a first to fourth current sensor, for ascertaining the level of the electric current of first to third phase conductors and of the neutral conductor of the three-phase AC circuit, which each provide first to fourth analog current signals;

an interruption unit having contacts, for interrupting the three-phase AC circuit; and an electronic trip unit, connected to the current sensors and the interruption unit and having a microprocessor, which are configured such that exceedance of current and/or current/time interval limit values for at least one phase conductor results in an interruption to the three-phase AC circuit being prompted.

According to at least one embodiment of the invention, there is provision for a multiplexer for the current signals, so that only one analog-to-digital converter is needed. The low-voltage circuit breaker is configured such that the first to fourth analog current signals are supplied to a multiplexer that supplies the thus time-division-multiplexed analog current signals to an analog-to-digital converter (ADC). The latter converts the level of an analog current signal into a digital current value at one time, so that there are periodically four time-division-multiplexed digital current signals, wherein the serial conversion results in there being digital current values of first to fourth digital current signals in first to fourth successive time frames.

Three of the four digital current signals are supplied to three interpolation functions that each ascertain interpolated current values, i.e. one or at least one current value per current signal, for the time frame of the uninterpolated digital current signal. The current value of the uninterpolated time frame and the interpolated current values (e.g. one current value per current signal) for the time frame of the uninterpolated current signal are used for detecting a ground fault. That is to say that in each case four current values are used, one uninterpolated current value and three interpolated current values, for detecting a ground fault. Each of the four current values is respectively associated with one of the three phase conductors or the neutral conductor.

This has the advantage that ground fault currents can be calculated using fewer hardware components. The error arising as a result of the economy and multiplexing is compensated for according to an embodiment of the invention by way of interpolation.

Advantageous configurations of embodiments of the invention are specified in the claims.

In one advantageous configuration embodiment of the invention, the interpolation is performed in a microprocessor of the electronic trip unit.

This has the particular advantage that, besides the detection, the preprocessing/interpolation of the measured values is also performed in the microprocessor, allowing simple realization as a result of powerful microprocessors.

In one advantageous configuration of an embodiment of the invention, the ground fault discovery is performed by adding the current value of the uninterpolated time frame and the current values interpolated therefor.

This has the particular advantage that particularly inexpensive ground fault detection is rendered possible. The added current value may only need to be compared with one threshold value.

In one advantageous configuration of an embodiment of the invention, an interpolated current value is ascertained for a digital current signal for the time frame of the uninterpolated digital current signal by way of a linear interpolation.

This has the particular advantage that a particularly simple interpolation is used that is simple to realize and requires little computing power.

In one advantageous configuration of an embodiment of the invention, the linear interpolation is effected such that the current value before and after the time frame of the uninterpolated current value is used to ascertain a rise that is multiplied by the time difference at the desired time within the time frame of the uninterpolated current value in order to obtain the interpolated current value.

This has the particular advantage that there is simple realization for the linear interpolation.

In one advantageous configuration of an embodiment of the invention, the low-voltage circuit breaker is a compact circuit breaker.

This has the particular advantage that, particularly for compact power, space-saving ground fault detection is rendered possible by economizing on hardware components.

In one advantageous configuration of an embodiment of the invention, the electronic trip unit features the multiplexer.

This has the particular advantage that there is particularly compact realization.

In one advantageous configuration of an embodiment of the invention, the multiplexer and the analog-to-digital converter have an amplifier and/or impedance converter arranged between them.

This has the particular advantage that there is conditioning of the multiplexed signal, in order to allow matching to the analog-to-digital converter if need be.

In one advantageous configuration of an embodiment of the invention, the microprocessor features the analog-to-digital converter.

This has the particular advantage that there is particularly compact realization.

In one advantageous configuration of an embodiment of the invention, the multiplexer, the analog-digital converter and the function of the microprocessor are embodied as an ASIC or FPGA.

This has the particular advantage that all components are combined compactly in one circuit, so that particularly spacesaving realization is rendered possible.

Further, a coordinate advantageous method is disclosed in an embodiment, in which first to fourth analog current signals of the first to third phase conductors and of the neutral conductor of the three-phase AC circuit are ascertained that each contain the level or an equivalent of the level of the current. According to an embodiment of the invention, the analog current signals are time-division multiplexed, subjected to analog-to-digital conversion, so that there is a sequence of time-division-multiplexed first to fourth digital current signals that are present in first to fourth successive time frames. Three of the four digital current signals are interpolated, wherein interpolated current values for the time frame of the uninterpolated digital current signal are ascertained. The current value of the time frame of the uninterpolated current signal and the interpolated current values for the time frame of the uninterpolated current signal are used for discovering the ground fault.

That is to say that in each case four current values are used, one uninterpolated current value and three interpolated current values, for detecting a ground fault. Each of the four current values is respectively associated with one of the three phase conductors or the neutral conductor. This is performed periodically for each of the first to fourth time frames and current signals.

According to an embodiment of the invention, there can be provision for a linear interpolation, wherein the latter can be effected such that the current value before and after the time frame of the uninterpolated current value is used to ascertain a rise that is multiplied by the time difference at the desired time within the time frame of the uninterpolated current value, in order to obtain the interpolated current value.

The ground fault discovery is performed by adding the current value of the uninterpolated time frame and the current values interpolated therefor.

At least one embodiment brings about an improvement in a circuit breaker, in particular a reduction in the hardware expense for ground fault discovery.

FIG. 1 shows a schematic block diagram of a low-voltage circuit breaker LS. FIG. 1 shows electrical conductors L1, L2, L3, N of a low-voltage circuit, for example a three-phase AC circuit, wherein the first conductor L1 forms the first phase with the first phase current P1, the second conductor L2 forms the second phase with the second phase current P2 and the third conductor L3 forms the third phase with the third phase current P3 and the fourth conductor forms the neutral conductor N with the neutral conductor current NS of the three-phase AC circuit.

In the example shown in FIG. 1, (only) the first conductor L1 is connected to an energy converter EW (for example as part of a converter set—more specifically for all the phases L1, L2, L3 and N) such that at least part of the current, i.e. a conductor partial current, or the entire current of the first conductor L1 flows through the primary side of the energy converter EW. Usually, one conductor, in the example the first conductor L1, forms the primary side of the energy converter EW. The energy converter EW is usually a transformer having a core, e.g. an iron-cored transformer. In one configuration, there can be provision for an energy converter EW in each phase or in each conductor of the electrical circuit. The secondary side of the energy converter EW or of each energy converter provided is connected to a power supply unit NT (or multiple power supply units) that makes available an energy supply, e.g. an intrinsic supply, for example in the form of a supply voltage, for the electronic trip unit ETU, represented by a dashed connection of operating voltage conductors BS. The power supply unit NT may moreover also be connected to at least one current sensor or all the currents sensors SE1, SE2, SE3, SEN, for supplying energy to the current sensors—if necessary.

Each current sensor SE1, SE2, SE3, SEN has at least one sensor element, for example a Rogowski coil, a measuring resistor/shunt, a Hall sensor, or the like, for ascertaining the level of the electric current of its associated conductor of the electrical circuit. In the example, the first current sensor SE1 is associated with the first conductor L1, i.e. with the first phase; the second current sensor SE2 is associated with the second conductor L2, i.e. with the second phase; the third current sensor SE3 is associated with the third conductor L3, i.e. with the third phase; the fourth current sensor SEN is associated with the (fourth conductor) neutral conductor N.

The first two fourth current sensors SE1, SE2, SE3, SEN are used to ascertain the level of the electric current of each phase conductor L1, L2, L3 and of the neutral conductor N of the electrical circuit.

The first to fourth current sensors SE1, SE2, SE3, SEN are connected to the electronic trip unit ETU and transmit thereto the level of the electric current of the respective conductor in the form of first to fourth analog current signals P1, P2, P3, NS.

The transmitted currents signals P1, P2, P3, NS or current values are compared with current limit values and/or current/time interval limit values, forming grounds for tripping, in the electronic trip unit ETU. Exceedance of the limit values results in an interruption to the electrical circuit being prompted. This realizes overcurrent and/or short circuit protection. This can be effected for example by virtue of there being provision for an interruption unit UE that is firstly connected to the electronic trip unit ETU and secondly has contacts K for interrupting the conductors L1, L2, L3, N or further conductors. In this case, the interruption unit UE is provided with an interrupt signal for opening the contacts K.

The electronic trip unit ETU can also be used to effect what is known as ground fault detection. To this end, the current signals or current values of the conductors are not individually compared with limit values, but rather for example summation of the current signals or current values is performed beforehand, and the sum is compared with at least one ground fault limit value. Exceedance of the latter results in an error message and/or interruption to the electrical circuit being effected.

Figure 2:
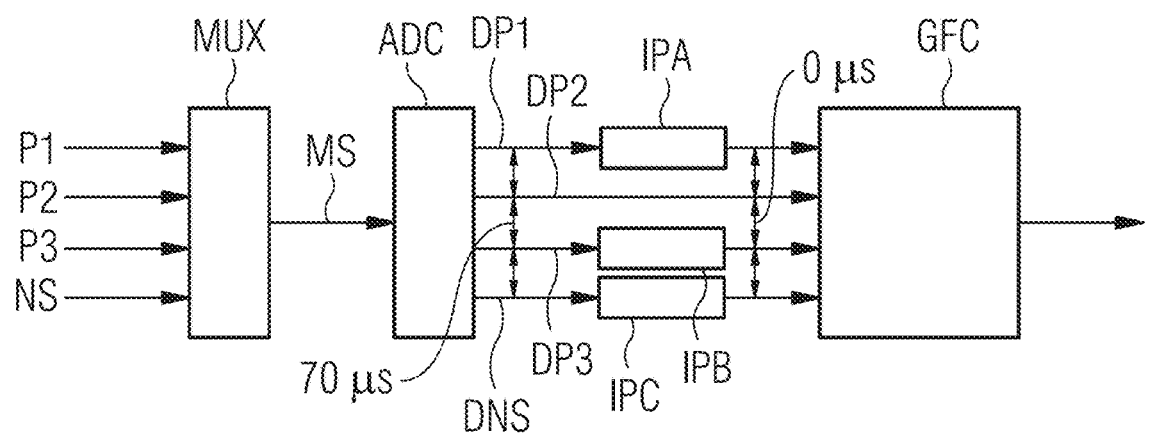
FIG. 2 shows a configuration according to an embodiment of the invention for a low-voltage circuit breaker.

FIG. 2 shows a configuration according to an embodiment of the invention for a low-voltage circuit breaker as shown in FIG. 1. The first to fourth analog current signals P1, P2, P3, NS are supplied according to an embodiment of the invention to a multiplexer MUX that time-division multiplexes them. That is to say that it switches cyclically between the four current signals, for example using a periodically switching changeover switch, for example every 70 μs, so that a cyclic sequence of the first to fourth current signals MS, i.e. time-division multiplexed analog current signals, is delivered and is supplied to an analog-to-digital converter ADC. In this case, for example the first current signal P1 is applied to the analog-to-digital converter for 70 μs, the second current signal P2 is applied to the analog-to-digital converter for the next 70 μs, the third current signal P3 is applied to the analog-to-digital converter for the next 70 μs and the fourth current signal NS is applied to the analog-to-digital converter for the next 70 μs. The first current signal P1 can then be applied again or there can be a pause, for example of 358 μs, until the first current signal P1, at the level of the current at this time, is applied again.

In the period in which the respective current signal is applied, the analog-to-digital converter ADC converts the analog value of the current signal into a digital value. That is to say that e.g. if the first current signal P1 is applied for a period of 70 μs, the level of the analog current signal is converted into a digital current value P1.0, P2.0, P3.0, P4.0, NS.0, P1.1, P2.1, P3.1, NS.1, etc., within this period, for example after 40 μs.

Digital current values are thus delivered by the analog-to-digital converter ADC every 70 μs, if need be with a pause after the fourth current value. The digital current values are thus present in successive time frames of e.g. 70 μs duration. The current values in the time frames form the first to fourth digital current signals DP1, DP2, DP3, DP4.

In the example shown in FIG. 2, the first digital current signal DP1 (i.e. in each case the time frames with the current values of the first conductor L1) is supplied to a first interpolation function IPA, the third digital current signal DP3 (i.e. in each case the time frames with the current values of the third conductor L3) is supplied to a second interpolation function IPB, the fourth digital current signal DNS (i.e. in each case the time frames with the current values of the neutral conductor N) is supplied to a third interpolation function IPC.

The second current signal DP2 is not supplied to an interpolation function.

The interpolation functions each ascertain interpolated current values for a particular time, in particular for a time for the time frame of the current signal that is not supplied to an interpolation function; in the example, the second current signal.

The interpolated current values of the interpolation functions IPA, IPB, IPC and the uninterpolated current value are supplied to a ground fault current calculation function GFC that calculates a ground fault current from the current values. The calculated ground fault current is supplied to a ground fault detection unit GFS that compares the ascertained ground fault current with one or more ground fault limit values. Exceedance results in an error message being delivered and/or an interruption to the electrical circuit being prompted.

The multiplexer MUX and the analog-to-digital converter ADC can have one or more amplifiers and/or impedance converters (not depicted) arranged between them.

The ground fault current calculation function GFC, the ground fault detection unit GFS, the interpolation functions IPA, IPB, IPC can be part of the electronic evaluation unit ETU, in particular of a microcontroller contained therein. The same goes for the analog-to-digital converter ADC, and in one configuration the multiplexer MUX. These units can also be realized in an ASIC (application specific integrated circuit) or FPGA (field programmable gate array); this results in large-scale integration and a compact design.

Figure 3:
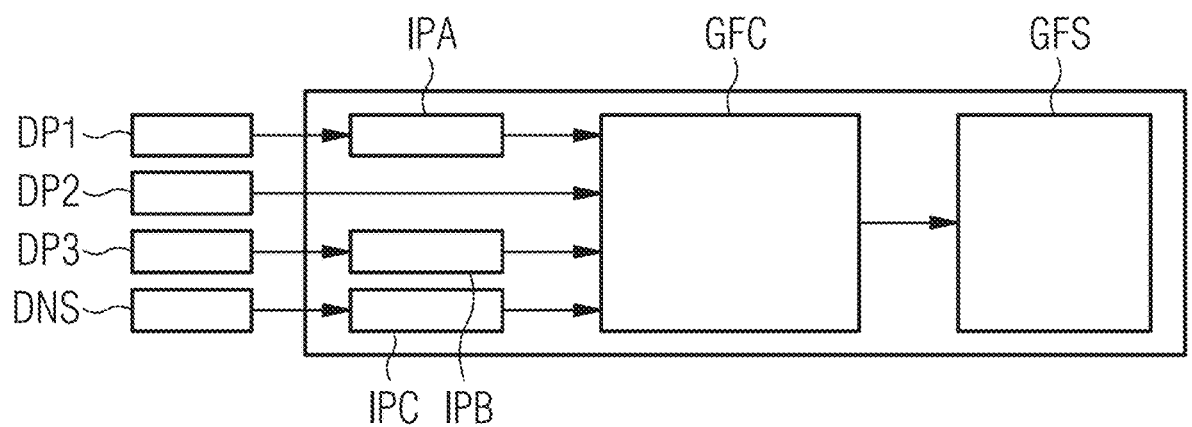
FIG. 3 shows a functional representation to explain an embodiment of the invention.

FIG. 3 shows a functional representation to explain an embodiment of the invention shown in FIG. 2, with the difference that the ground fault detection unit GFS is shown. Functionally, four temporally successive current signals DP1, DP2, DP3, DNS are periodically used, three current signals of which are supplied to three interpolation functions IPA, IPB, IPC, with three current values respectively being ascertained at the time of the uninterpolated current value, for example by way of a linear interpolation.

FIG. 4 shows a first temporal representation to explain an embodiment of the invention, in which a horizontal time axis t is depicted. The time axis t features times in μs. FIG. 5 shows the time axis shown in FIG. 4, a vertical axis for the current I in A (amps) being depicted. In the graph formed by the two axes, digital current values are plotted over time.

At a first time t1, there is a first digital current value P1.0 of the first digital current signal DP1. At the second time t2, there is a first digital current value P2.0 of the second digital current signal DP2. At the third time t3, there is a first digital current value P3.0 of the third digital current signal DP3. At the fourth time t4, there is a first digital current value NS.0 of the fourth digital current signal DNS. At a fifth time t5, there is a first digital current value GF.0 of a fifth current signal, which is not described more specifically, but possible.

At an eleventh time t11, there is a second digital current value P1.0 of the first digital current signal DP1. At the twelfth time t12, there is a second digital current value P2.0 of the second digital current signal DP2. At the thirteenth time t13, there is a second digital current value P3.0 of the third digital current signal DP3. At the fourteenth time t14, there is a second digital current value NS.0 of the fourth digital current signal DNS. At a fifteenth time t15, there is a second digital current value GF.1 of a fifth current signal, which is not described more specifically, but possible.

In an analogous sequence, there are further digital current values (third, fourth, fifth, . . . ), in the example third digital current values P1.2, P2.2, P3.2, NS.2, of the first to fourth digital current signals DP1, DP2, DP3, DNS.

In the example shown in FIG. 4 or 5, there are digital current values of the digital current signals every 568 µs. That is to say that when there is the first digital current value, there is the second digital current value after 568 µs, the third digital current value after a further 568 µs, in each case for each digital current signal.

The interval between the digital current values of different digital current signals is in each case 70 µs in the example. That is to say that when there is the first digital current value P1.0 of the first digital current signal DP1, there is the first digital current value P2.0 of the second digital current signal DP2 after 70 µs, etc., see FIG. 4.

That is to say that there can be a greater interval of time between the first digital current value NS.0 of the fourth digital current signal DNS and the second digital current value P1.1 of the first digital current signal DP1, of 358 µs in the example.

A time frame is therefore 70 µs in the example. If eight time frames with first digital current values are possible, i.e. eight first digital current values of eight digital current signals would be possible, then eight second digital current values of the eight digital current signals could follow, etc. After 8 digital current values, there can be provision for a pause frame, with a length of 8 µs in the example.

As shown in FIG. 5, an interpolated current value is ascertained or interpolated current values are ascertained for the twelfth time t12. This is the time at which there is the second current value P2.1 of the second current signal DP2, which according to the example is not supplied to an interpolation function. As such, the current value before (P1.1) and the current value after (P1.2) the time frame of the uninterpolated current value (P2.1) are used to ascertain an interpolated current value IP1.1.2.1 for the first digital current signal DP1, i.e. for the twelfth time t12.

In an analogous manner, the current value before (P3.0) and the current value after (P3.1) the time frame of the uninterpolated current value (P2.1) are used to ascertain an interpolated current value IP3.1.2.1 for the third digital current signal DP3 for the twelfth time t12.

The ascertainment of the interpolated current value IP1.1.2.1. or IP3.1.2.1. for the twelfth time t12 can be effected by way of a linear interpolation, for example.

By way of example, a rise that is multiplied by the time difference at the desired time within the time frame of the uninterpolated current value in order to obtain the interpolated current value can be ascertained.

By way of example, the current value P1.2 after the time frame of the uninterpolated time frame can be deducted from the current value P1.1 before the time frame of the uninterpolated time frame. This difference can be divided by the time difference between the two current values (in the example 568 µs). This quotient is multiplied in the example by the interval of time at the twelfth time t12, in the example 70 µs (t12 minus t11).

For the interpolated third current value IP3.1.2.1, the calculation would be analogous, wherein only the interval of time at the twelfth time t12 would be 498 µs (t12 minus t3).

For an interpolated current value IP at the desired time tip, the following calculation is therefore obtained for a current value before Pvor, at the time tvor, and a current value after Pnach, at the time tnach, the uninterpolated time frame:

$$IP(tip) = [(Pnach - Pvor)/(tnach - tvor)] \times (tip - tvor) + Pvor$$

Pvor corresponds to the current offset. If the current value Pvor were not also added, the "current point" (Pvor/tvor) would correspond to the origin at the coordinates (0/0).

An embodiment of the invention is described once again below in other words.

According to an embodiment of the invention, an arrangement and a method are proposed that can be used to calculate a ground fault current using fewer hardware components. To this end, the ground fault current, e.g. in the firmware, of the low-voltage circuit breaker is ascertained by addition from the measured values of the phase currents (phase conductors L1, L2, L3). When measuring these phase values, a single analog-to-digital converter ADU is used according to an embodiment of the invention. As a result of the serial conversion over time, this leads to there being the measured values of the individual phases with staggered timing. When the fault current is determined using addition of uncorrected phase measured values, an error therefore arises. This error is reduced sufficiently according to an embodiment of the invention by interpolation of the measured values (current values), so that sufficiently accurate determination of the ground fault current is rendered possible.

The current measured values or phase measured values, i.e. the level of the current of the conductors, are converted via a single analog-to-digital converter. This renders a hardware circuit having four analog-to-digital converters or similar realization unnecessary. In this manner, it is possible for costs and circuit board area, that is to say installation space, in the low-voltage circuit breaker to be saved.

According to an embodiment of the invention, the measured values (analog current signals) of the conductors are supplied to a multiplexer MUX that, via multiplexing, makes available analog current values, in the example at an interval of 70 µs, the interval between a first set of analog current values and the second set of analog current values for phases being able to be greater, for example 358 µs.

These analog current values are digitized using the single analog-to-digital converter and, in this case too, are present with staggered timing, e.g. are present with a time offset of 70 µs.

For the ground fault current discovery by way of addition of the conductor currents, however, the current values should be present at the same time, otherwise errors arise that, depending on the signal form, are not negligible.

An embodiment of the invention provides for compensating for the time offset by way of interpolation. Thus, functions are calculated that connect the measured values of the phases. From these functions, a value is ascertained or taken at the same time for all the phases. This provides values without a time difference between the phases.

More precisely, an embodiment of the invention provides for realizing the interpolation between the measured values using linear functions.

In the example, the time chosen is when there are current values of the second conductor L2 or of the second phase. The current value P2.0, P2.1, P2.2 of the second digital current signal can be used directly for the further processing, for example addition.

For the other conductors or phases, figuratively speaking, the measured values before and after the sought time are plotted over a time axis and connected by a straight line. From this straight line, the value at the time of the measurement from the second conductor/the second phase is taken; i.e. of the uninterpolated current value.

In a manner of speaking, the value that the current would have/had at this time (by interpolation) is calculated. This calculation is performed for all required conductors, so that there are values for the required conductors at the same time. These are then added, for example, in order to obtain the ground fault current.

The interpolation does not model the original signal perfectly; the calculated values do not correspond exactly to the current values or phase values at the sought time. However, the error obtained when determining the ground fault current by way of addition is significantly reduced, which means that a substantially more accurate statement about a ground fault current that there may be is possible.

In an advantageous configuration, according to an embodiment of the invention:
- a single analog-to-digital converter is used for digitizing current values,
- the ground fault current calculation is performed by way of an addition,
- the time offset between the individual current values is reduced by way of an interpolation.

The solution brings about circuitry savings (hardware) and reduces the space requirement for the ground fault detection function.

Although the invention has been illustrated and described more specifically in detail by the example embodiment, the invention is not limited by the disclosed examples, and other variations can be derived therefrom by a person skilled in the art without departing from the scope of protection of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A low-voltage circuit breaker with ground fault detection for a low-voltage three-phase AC circuit including a neutral conductor, comprising:
   a plurality of current sensors including a first current sensor, a second current sensor, a third current sensor and a fourth current sensor, to each respectively ascertain a level of electric current of a respective one of a plurality of phase conductors including a first phase conductor, a second phase conductor, a third phase conductor and a neutral conductor of the low-voltage three-phase AC circuit, and to each respectively provide a respective one of a plurality of analog current signals including a first analog current signal, a second analog current signal, a third analog current signal and a fourth analog current signal;
   an interruption unit including contacts, to interrupt the three-phase AC circuit;
   an electronic trip unit, connected to the plurality of current sensors and the interruption unit and including a microprocessor, configured such that exceedance of at least one of current and current/time interval limit values for at least one phase conductor of the plurality of phase conductors results in an interruption to the three-phase AC circuit being prompted;
   a multiplexer to receive the plurality of analog current signals and to supply time-division-multiplexed analog current signals to an analog-to-digital converter, the time-division-multiplexed analog current signals including four time-division-multiplexed digital current signals, each including a digital current value, resulting in four digital current values including a first digital current value, a second digital current value, a third digital current value, and a fourth digital current value respectively in a first successive time frame, a second successive time frame, a third successive time frame, and a fourth successive time frame,
   wherein three digital current signals of the four digital current signals are interpolated, via three respective interpolation functions, to respectively ascertain three interpolated current values for the time frame of an uninterpolated digital current signal of the plurality of digital current signals, resulting in a plurality of interpolated current values, and
   wherein a current value of the time frame of the uninterpolated current signal, and the plurality of interpolated current values for the respective time frame of the uninterpolated current signal, are used for detecting a ground fault.

2. The low-voltage circuit breaker of claim 1, wherein the interpolation is performed in the microprocessor of the electronic trip unit.

3. The low-voltage circuit breaker of claim 2, wherein the detecting of the ground fault is performed by adding the current value of the uninterpolated time frame and the plurality of interpolated current values.

4. The low-voltage circuit breaker of claim 2, wherein at least one of an amplifier and an impedance converter is arranged between the multiplexer and the analog-to-digital converter.

5. The low-voltage circuit breaker of claim 2, wherein the multiplexer, the analog-to-digital converter and a function of the microprocessor are embodied as an ASIC or FPGA.

6. The low-voltage circuit breaker of claim 1, wherein the detecting of the ground fault is performed by adding the current value of the uninterpolated time frame and the plurality of interpolated current values.

7. The low-voltage circuit breaker of claim 6, wherein a respective interpolated current value is ascertained for a respective digital current signal for the time frame of the uninterpolated digital current signal by way of a linear interpolation.

8. The low-voltage circuit breaker of claim 7, wherein the respective linear interpolation is effected such that a current value before the time frame of the uninterpolated current value and after the time frame of the uninterpolated current value are used to ascertain a rise, the rise being multiplied by a time difference at a time within the time frame of the uninterpolated current value to produce a result, and the respective current value before the time frame of the uninterpolated current value is added to a result, to obtain the respective interpolated current value.

9. The low-voltage circuit breaker of claim 1, wherein a respective interpolated current value is ascertained for a respective digital current signal for the time frame of the uninterpolated digital current signal by way of a linear interpolation.

10. The low-voltage circuit breaker of claim 9, wherein the respective linear interpolation is effected such that a current value before the time frame of the uninterpolated current value and after the time frame of the uninterpolated current value are used to ascertain a rise, the rise being multiplied by a time difference at a time within the time frame of the uninterpolated current value to produce a result, and the respective current value before the time frame of the uninterpolated current value is added to a result, to obtain the respective interpolated current value.

11. The low-voltage circuit breaker of claim 1, wherein the low-voltage circuit breaker is a compact circuit breaker.

12. The low-voltage circuit breaker of claim 1, wherein the electronic trip unit features the multiplexer.

13. The low-voltage circuit breaker of claim 1, wherein at least one of an amplifier and an impedance converter is arranged between the multiplexer and the analog-to-digital converter.

14. The low-voltage circuit breaker of claim 1, wherein the microprocessor features the analog-to-digital converter.

15. The low-voltage circuit breaker of claim 1, wherein the multiplexer, the analog-to-digital converter and a function of the microprocessor are embodied as an ASIC or FPGA.

16. A method for discovering a ground fault for a low-voltage three-phase AC circuit including a neutral conductor, in which a plurality of analog current signals including a first analog current signal, a second analog current signal, a third analog current signal and a fourth analog current signal, respectively of a first phase conductor, a second phase conductor, a third phase conductor and of the neutral conductor of the three-phase AC circuit, are ascertained to each contain a level or an equivalent of a level of current, the method comprising:

time-division multiplexing the plurality of analog current signals to subject the plurality of analog current signals to analog-to-digital conversion, to produce a sequence of a plurality of time-division-multiplexed digital current values including a first digital current value, a second digital current value, a third digital current value and a fourth digital current value, respectively present in first to fourth successive time frames and respectively forming a plurality of digital current signals including a first digital current signal, a second digital current signal, a third digital current signal and a fourth digital current signal; and interpolating three of four of the plurality of digital current signals, to respectively ascertain three interpolated current values for the time frame of an uninterpolated digital current signal of the plurality of digital current signals, resulting in a plurality of interpolated current values; and discovering the ground fault using a current value of the time frame of the uninterpolated current signal, and the plurality of interpolated current values for the time frame of the uninterpolated current signal.

17. The method of claim 16, further comprising:

effecting a linear interpolation, the linear interpolation being effected such that a current value before the time frame of the uninterpolated current value and a current value after the time frame of the uninterpolated current value is used to ascertain a rise, the rise being multiplied by a time difference at a time within the time frame of the uninterpolated current value to produce a result, and the respective current value before the time frame of the uninterpolated current value is added to a result, to obtain the respective interpolated current value.

18. The method of claim 17, wherein the discovering of the ground fault is performed by adding the current value of the uninterpolated time frame and the plurality of interpolated current values of the uninterpolated time frame.

19. The method of claim 16, wherein the discovering of the ground fault is performed by adding the current value of the uninterpolated time frame and the plurality of interpolated current values of the uninterpolated time frame.

20. A non-transitory computer-readable storage medium storing electronically readable control information, which when executed by a controller of a low-voltage three-phase AC circuit including a neutral conductor, in which a plurality of analog current signals including a first analog current signal, a second analog current signal, a third analog current signal and a fourth analog current signal, respectively of a first phase conductor, a second phase conductor, a third phase conductor and of the neutral conductor of the three-phase AC circuit, are ascertained to each contain a level or an equivalent of a level of current, configures the controller to perform at least:

time-division multiplexing the plurality of analog current signals to subject the plurality of analog current signals to analog-to-digital conversion, to produce a sequence of a plurality of time-division-multiplexed digital current values including a first digital current value, a second digital current value, a third digital current value and a fourth digital current value, respectively present in first to fourth successive time frames and respectively forming a plurality of digital current signals including a first digital current signal, a second digital current signal, a third digital current signal and a fourth digital current signal; and interpolating three of four of the plurality of digital current signals, to respectively ascertain three interpolated current values for the time frame of an uninterpolated digital current signal of the plurality of digital current signals, resulting in a plurality of interpolated current values; and discovering a ground fault using a current value of the time frame of the uninterpolated current signal, and the plurality of interpolated current values for the time frame of the uninterpolated current signal.

* * * * *